United States Patent
Grasso et al.

(10) Patent No.: US 6,809,571 B2
(45) Date of Patent: Oct. 26, 2004

(54) POWER CONTROL CIRCUIT WITH ACTIVE IMPEDANCE TO AVOID INTERFERENCE AND SENSING PROBLEMS

(75) Inventors: Massimo Grasso, Pavia (IT); Giovanni Galli, Messina (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/966,091

(22) Filed: Oct. 1, 2001

(65) Prior Publication Data

US 2003/0062947 A1 Apr. 3, 2003

(51) Int. Cl.[7] .............................................. H03K 17/30
(52) U.S. Cl. ..................................... 327/379; 327/384
(58) Field of Search ................................. 327/108, 109, 327/110, 112, 379, 389

(56) References Cited

U.S. PATENT DOCUMENTS

| | | | | |
|---|---|---|---|---|
| 4,321,490 A | * | 3/1982 | Bechdolt ..................... 326/19 |
| 4,363,068 A | * | 12/1982 | Burns ....................... 361/91.1 |
| 4,423,457 A | * | 12/1983 | Brajder ....................... 361/86 |
| 4,814,638 A | * | 3/1989 | Weick ......................... 326/56 |
| 4,910,416 A | * | 3/1990 | Salcone ....................... 327/339 |
| 5,055,721 A | * | 10/1991 | Majumdar et al. ......... 327/434 |
| 5,057,713 A | * | 10/1991 | Iwamura et al. ............ 326/110 |
| 5,099,138 A | * | 3/1992 | Fukunaga .................... 326/21 |
| 5,210,479 A | * | 5/1993 | Kimura et al. .............. 318/138 |
| 5,376,846 A | * | 12/1994 | Houston ....................... 326/32 |
| 5,444,591 A | * | 8/1995 | Chokhawala et al. ......... 361/18 |
| 5,546,045 A | * | 8/1996 | Sauer .......................... 327/310 |
| 5,731,729 A | * | 3/1998 | Ochi ........................... 327/312 |
| 5,852,538 A | * | 12/1998 | Masui ......................... 361/18 |
| 6,404,608 B1 | * | 6/2002 | Pryor et al. ................ 361/93.1 |

* cited by examiner

Primary Examiner—Terry D. Cunningham
(74) Attorney, Agent, or Firm—Ostrolenk, Faber, Gerb & Soffen, LLP

(57) ABSTRACT

A power control circuit includes sensing circuitry for sensing information about operation of a power device such as an IGBT or other power FET. The sensing circuitry receives a sense input signal from the power device through a gating device such as a diode. The power control circuit also includes active impedance circuitry for preventing the sense input signal from including spurious information received from the gating device. For example, if the gating device is a diode across which negative spikes can be capacitively coupled, the active impedance circuitry can prevent the negative spikes from reaching the sensing circuitry when the diode is off. The active impedance circuitry can take the form of a transistor connected between a power supply and a sensing node. The active impedance device can be switched on by a comparator when the voltage across the power device exceeds a reference voltage, indicating the power device is off. Alternatively, the active impedance device can be controlled by a comparator in the sensing circuitry that provides an output that similarly indicates whether the power device is on or off. The sensing circuitry and active impedance circuitry can be implemented on an integrated circuit.

27 Claims, 6 Drawing Sheets

POWER CONTROL CIRCUIT WITH ACTIVE IMPEDANCE TO AVOID INTERFERENCE AND SENSING PROBLEMS

BACKGROUND OF THE INVENTION

1. Field of the Invention

The present invention relates to a power control circuit with sensing circuitry to sense information about a power device and with active impedance circuitry to prevent sensing of spurious information. More particularly, the invention can be implemented in a noise immune power control circuit to eliminate spurious measurements due to high voltage surge and other causes.

2. Description of the Related Art

Circuits for driving electrical devices such as motors typically include power devices such as power field effect transistors (FETs) across which output power is provided. The power devices can also, for example, be insulated gate bipolar transistors (IGBTs).

Circuit 10 in FIG. 1, for example, is a conventional motor controller circuit with low side power FET 12 and high side power FET 14 illustratively connected with diodes 16 and 18 in a half bridge between a DC bus supplying 1200 volts and a common ground. Circuit 10 includes integrated circuit (IC) 20, a representative power IC for this and similar applications. On the low side, IC 20 includes driver 22, comparator 24, and buffer 26, and on the high side, driver 30, comparator 32, and buffer 34.

IC 20 has output pins for controlling power FETs 12 and 14 and also input pins for receiving information about operation of FETs 12 and 14.

In circuit 10, output pins LO and HO serve respectively as gate control pins for FETs 12 and 14. The central node of the half bridge is connected to pin VS, and provides voltage potential to the output device, in this case a motor.

Low side desat/voltage feedback (DSL/VFL) input pin serves to receive information about operation of FET 12, while high side desat/voltage feedback (DSH/VFH) input pin serves to receive information about operation of FET 14. The DSL/VFL and DSH/VFH pins provide desat input indicating a short circuit condition across a power FET, in response to which circuit 10 switches into a soft shutdown mode. The DSL/VFL and DSH/VFH pins also provide voltage feedback input indicating voltage across a power FET, in response to which a microprocessor controller for circuit 10 can manage power output to increase system efficiency. The DSL/VFL and DSH/VFH pins are examples of sensing nodes for connecting to power devices like FETs 12 and 14.

Information detected through desat and voltage feedback inputs of IC 20 can be understood from circuit 40 in FIG. 2, whose components represent either low or high side components of circuit 10, as suggested by the pin labels. In FIG. 2, components on IC 20 are shown at left, while components on a board on which IC 20 is mounted are shown at right.

In circuit 40, power FET 42, for example, represents either FET 12 or FET 14, with its gate connected either to the LO or the HO pin, which in turn receives gate control voltage from driver 44, representing either driver 22 or driver 30 on IC 20. Similarly, comparator 46 represents either comparator 24 or comparator 32, and buffer 48 represents either buffer 26 or buffer 34. Comparator 46 serves as part of sensing circuitry, providing a sense result signal in response to a sense input signal that includes information received at the DS/VF pin. The sense result signal at the output of comparator 46 includes information derived from the sense input signal about operation of FET 42.

The DS/VF pin is connected to a power supply, either $V_{CC}$ or output pin VB, through resistance 50, representing resistance 52 or resistance 54 in circuit 10. Resistance 50, which could for example be 100 Kohms, provides a sufficiently high impedance to reduce current.

Pin DS/VF senses the source to drain voltage across FET 42 through high voltage diode 60, representing diode 62 or diode 64 in circuit 10. Under normal conditions, diode 60 is forward biased and turns on when FET 42 is on; then, when FET 42 turns off, diode 60 becomes reverse biased and also turns off; then, when FET turns on again, diode 60 again becomes forward biased and turns on.

One function of diode 60 is to allow detection of a short circuit condition in which voltage across FET 42 is high even though FET 42 is gated on. When a short circuit condition occurs while FET 42 is on, damage to FET 42 must be prevented by turning it off through its gate signal. The short circuit condition causes the voltage at node 66 to rise, and diode 60 becomes reverse biased and turns off, indicating detection of the short circuit condition. As a result, current begins to flow through the path from $V_{CC}$ or VB through resistances 50, 70, and 72 to ground, in which resistances 70 and 72 are illustratively at 200 Kohms and 500 Kohms, respectively. The voltage at the DS/VF pin rises, and the voltage to the "+" input of comparator 46 also rises relative to the "−" pin. As a result, the output from comparator 46 goes high, indicating the short circuit condition turning off driver 44, which then turns off FET 42 through the gate signal.

One problem with the circuitry in FIGS. 1 and 2, referred to herein as "the interference problem", relates to high frequency noise from the DC bus. As shown in dashed lines, diode 60 behaves like capacitance 74 when it is off, allowing high frequency noise to reach comparator 46. For example, capacitance 74 can pass both negative and positive spikes, as shown by the waveforms in circle 76. A negative spike can pull down the voltage at the "+" input of comparator 46, falsely indicating a short circuit condition.

Another problem, referred to herein as "the sensing problem", relates to voltage feedback (VFB) information received through the DS/VF pin. To increase system efficiency, accurately timed VFB information indicating when FET 42 turns on and off should be provided to the controller, allowing it to make appropriate adjustments. In circuit 40, VFB information can be obtained using the same circuitry that detects short circuit conditions, by comparing the DS/VF pin voltage to a threshold or reference voltage received at the "−" input of comparator 46 from voltage source 80, representing either voltage source 82 or voltage source 84 on IC 20, which could be implemented, for example, with a zener diode or other appropriate device. Comparator 46 in turn provides a signal with VFB information to a microprocessor controller through buffer 48 and the VFL or VFH output pin.

When FET 42 is turned off, the DS/VF pin is at a high voltage relative to the threshold and comparator 46 provides a high output to buffer 48. Similarly, when FET 42 is turned on, the DS/VF pin is at a low voltage relative to the threshold and comparator 46 provides a low output to buffer 48.

The sensing problem arises because spurious signals can be provided while FET 42 makes a transition from off to on, as illustrated in FIG. 3. The upper waveform in FIG. 3 shows the voltage across FET 42, the middle waveform the voltage at the DS/VF pin relative to ground, and the lower waveform the VFB signal provided by comparator 46 through buffer 48 to the VFL or VFH pin.

From t0 to t1, FET 42 is turned off and the voltage across it has a high value of several hundred volts, as illustrated by segment 100 of the upper waveform. As a result, diode 60 is off, so that the voltage at the DS/VF pin is also high relative to ground, as illustrated by segment 102, and comparator 46 provides a high signal indicating that its "+" input is at a higher voltage than its "−" input, as illustrated by segment 104.

At t1, driver 44 begins to provide a high gate signal to FET 42 to turn it on. As a result, the voltage across FET 42 makes a rapid transition downward of several hundred volts in a few hundred nanoseconds, illustratively shown by segment 110.

During the off-to-on transition of FET 42, diode 60 remains temporarily off and therefore acts as a capacitor, so that a high frequency negative spike that passes through to the DS/VF pin, illustrated by segment 112, can cause comparator 46 to change state, illustrated by transition 114 at t2. This change of state does not accurately indicate a time at which the voltage across FET 42 crosses a threshold voltage VTH, however, because the voltage across FET 42 still exceeds the VTH.

During an on-to-off transition of FET 42, illustrated by the waveform segments between times t6, t7, and t8, diode 60 is on and the change of state of comparator 46 at t7 is accurately timed.

A central cause of the sensing problem is diode capacitance coupling during an off-to-on transition, leading to inaccurate VFB signal timing. As a result of coupling across diode 60, negative spikes and other spurious voltage variations can reach the DS/VF pin and cause inaccurately timed state changes by comparator 46. In addition, changes in the sizes of FET 42 and diode 60 as well as changes in the board and in the slope of segment 110 can affect VFB signal timing, contributing to VFB inaccuracies.

SUMMARY OF THE INVENTION

The present invention provides a new power control circuit that includes correction circuitry that prevents spurious information in a sense input signal. As a result, the correction circuitry alleviates the interference and sensing problems described above.

Like the circuits described above, the new circuit includes sensing circuitry, which can include a comparator as described above or other appropriate components to provide a sense result signal in response to a sense input signal. The sense input signal includes information received through a gating device, such as a diode or other appropriate device connected between the sensing circuitry and a power device; the sense result signal in turn includes information derived from the sense input signal about operation of the power device.

In addition, the circuit of the present invention includes correction circuitry that prevents the sense input signal from including spurious information received from the gating device. This elegant technique alleviates the interference and sensing problems described above and can be implemented with relatively simple circuitry.

Spurious information from the gating device can take the form of negative spikes, as described above. The correction circuitry can accordingly prevent negative spikes in the sense input signal. If the gating device is a diode and the power device is a FET, the correction circuitry can prevent negative spikes except when the FET is on.

The correction circuitry can, for example, include a switchable or "active" impedance that can be turned on to prevent spurious information. For example, the switchable impedance can be turned on when the power device is turned off and, conversely, turned off when the power device is turned on.

Where the sensing circuitry includes a comparator, as described above, the correction circuitry can receive the sense result signal from the comparator's output. The correction circuitry can prevent negative spikes when the sense result signal indicates that the sense input signal is greater than a reference signal, indicating that the power device is off.

The circuit of the present invention can be embodied in an integrated circuit that includes sensing circuitry and correction circuitry. As described above, the integrated circuit can have a sensing node for connecting to the FET or other power device through the diode or other gating device. The switchable impedance can be connected between a power supply and the sensing node. Where the integrated circuit include components such that the sense input signal drops below a reference voltage if the gating device turns off, including a resistance between the power supply and the sensing node, the switchable impedance can be parallel to this resistance. The correction circuitry can also include switching circuitry for switching the impedance on and off in response to a signal indicating whether the power device is on or off, with the switchable impedance being turned on except when the power device is on. The signal indicating the device's state can be provided by a comparator in the correction circuitry, or it can be received from the sensing circuitry.

Other features and advantages of the present invention will become apparent from the following description of the invention which refers to the accompanying drawings.

DETAILED DESCRIPTION OF THE PREFERRED EMBODIMENT(S)

Figure 2:
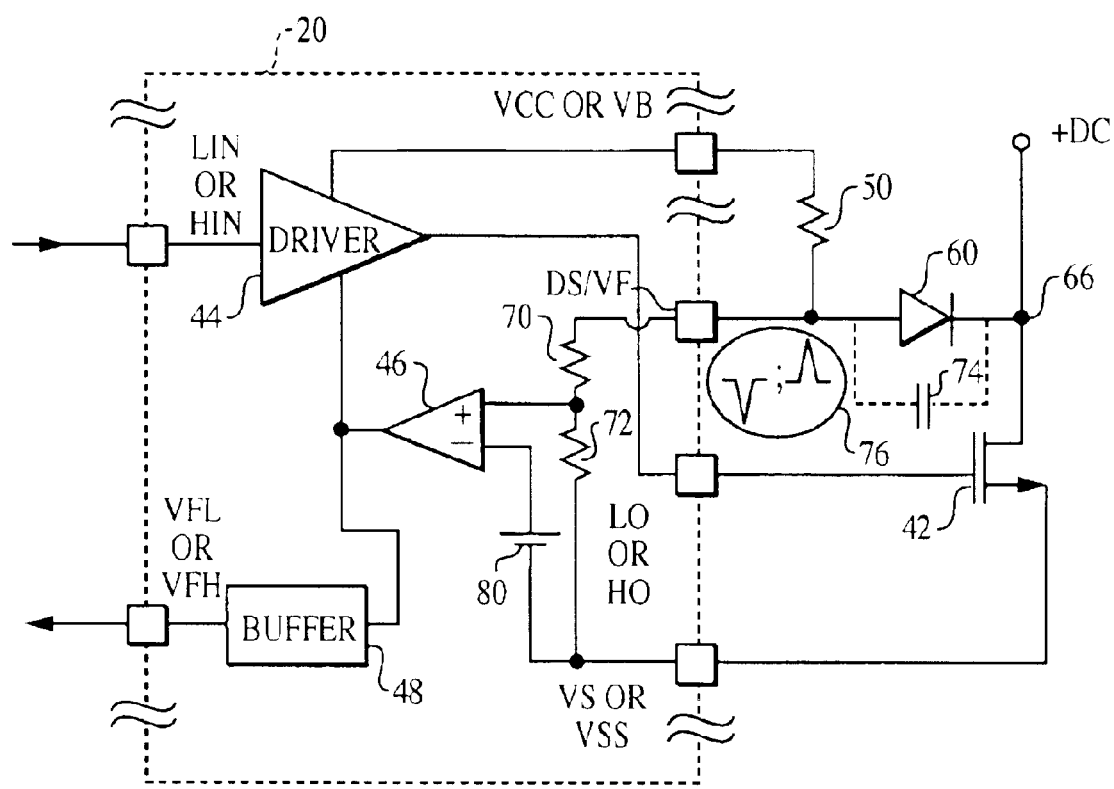
FIG. 2 is a schematic circuit diagram showing in greater detail some components of the high or low side of the conventional circuit in FIG. 1 for sensing short circuit and voltage feedback through a desat/voltage feedback (DS/VF) input pin.
Figure 4:
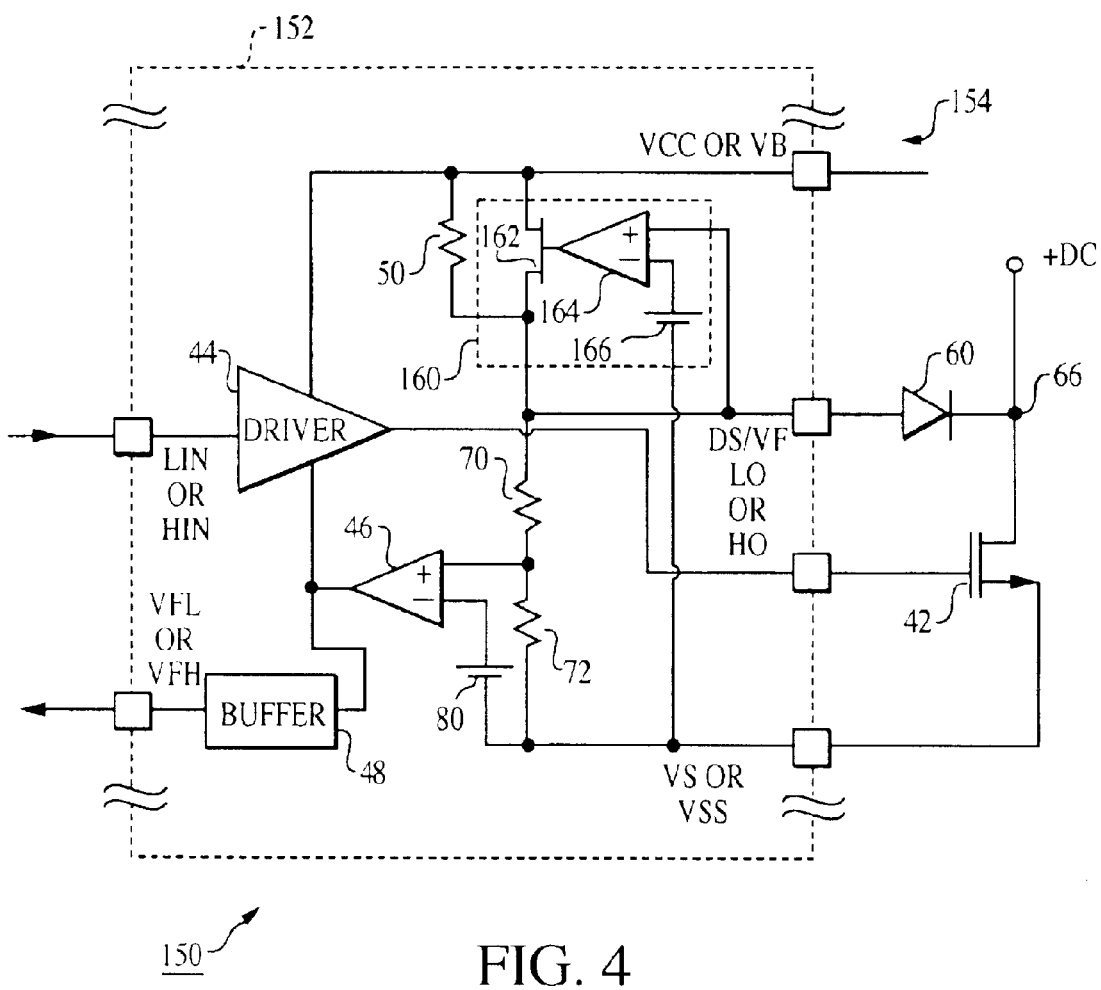
FIG. 4 is a schematic circuit diagram of a power control circuit with a switchable impedance between a power supply and a DS/VF pin.

In FIG. 4, circuit 150 includes components on IC 152 and on board 154 on which IC 152 may be mounted. Components equivalent to components in FIG. 2 are labeled with the same reference numerals and can be understood from the above description.

Circuit 150 includes active bias circuitry 160 on IC 152. Circuitry 160 functions as correction circuitry to prevent the upper input signal to comparator 46 from including spurious information received from diode 60. By preventing spurious information, circuitry 160 alleviates the interference and sensing problems described above. Various other types of correction circuitry could be used in power control circuits with similar or different types of sensing circuitry.

Figure 1:
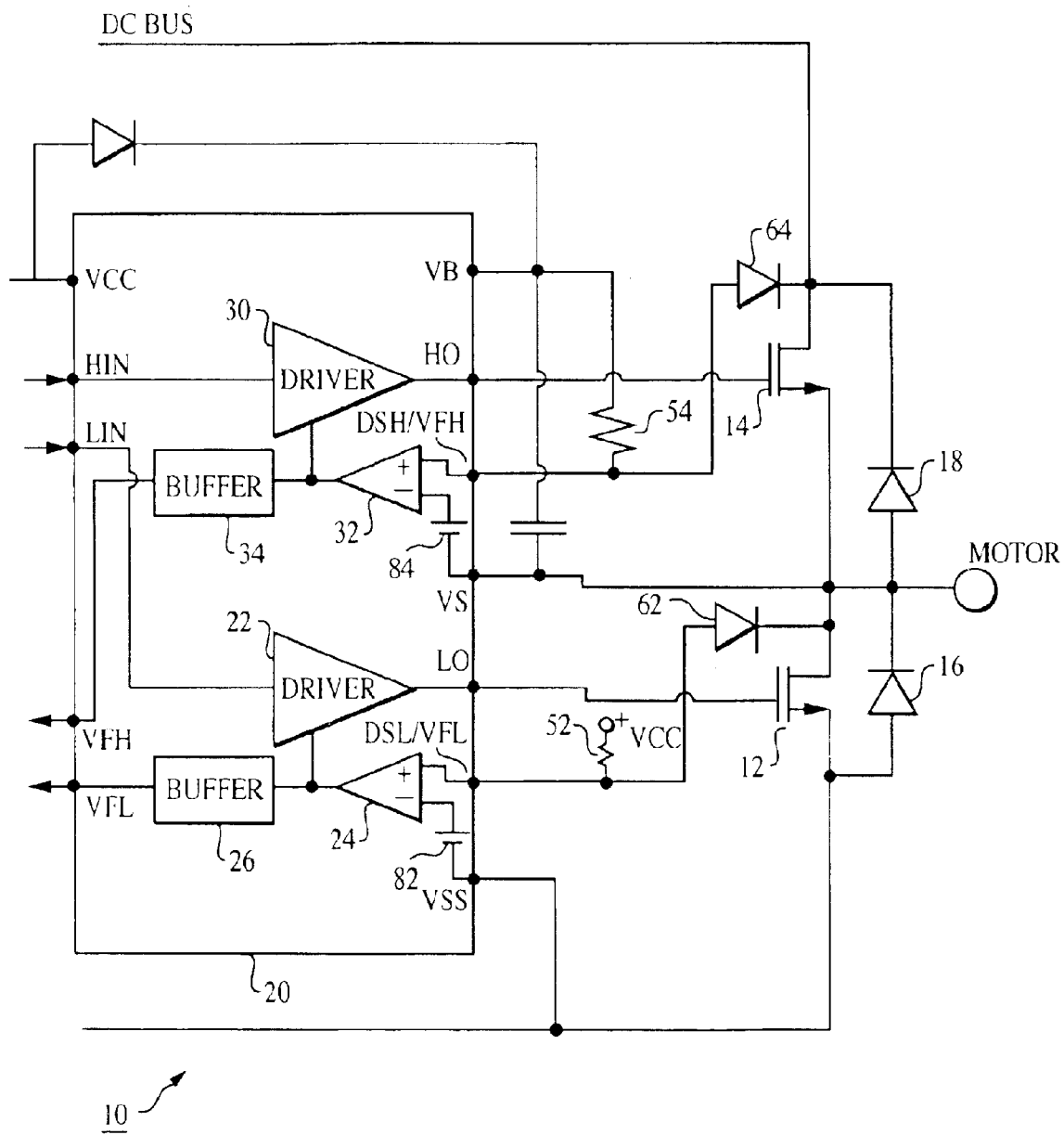
FIG. 1 is a schematic circuit diagram showing a conventional integrated power control circuit driving a half bridge motor controller with high and low side power field effect transistors (FETs), each with a respective driver and circuitry for sensing power FET operation.

Circuitry 160 includes switchable impedance element 162, an FET, connected between a power supply and the DS/VF pin to provide an active impedance at the pin. Impedance element 162 is parallel to resistance 50, shown in FIG. 4 as on IC 152 but which could instead be on the board on which IC 152 is mounted, as in FIGS. 1 and 2. Impedance element 162 can be switched to prevent a negative spike from reaching comparator 46 without unnecessary increase in current. In contrast, merely reducing resistance 50 would reduce the effect of a negative spike, but would increase current.

Element 162 is illustratively switched by output from comparator 164, with its "+" input connected to receive the voltage at the DS/VF pin and its "−" input connected to receive an appropriate reference voltage from voltage source 166, which is shown as a battery but could be implemented with a zener diode or other appropriate device. When the output from comparator 164 is low, element 162 is turned off, but when comparator output is high, element 162 is turned on.

When FET 42 is on and voltage at DS/VF is low, amplifier 164 provides a low output, turning off element 162. In this case, no active impedance is provided, and the DS/VF pin sees the high impedance input of comparator 46 and a low impedance through diode 60 and FET 42, both of which are turned on. As a result, any spikes will follow the low impedance path through FET 42 to ground.

But when FET 42 is off and voltage at DS/VF is higher than the reference voltage from source 166, comparator 164 provides a high output, turning on element 162 to provide an active impedance at the DS/VF pin. In this case, the DS/VF pin sees a sufficiently low impedance through element 162 to sink a high frequency negative spike received as a result of capacitive coupling across diode 60. This solution therefore alleviates the interference problem.

Figure 5:
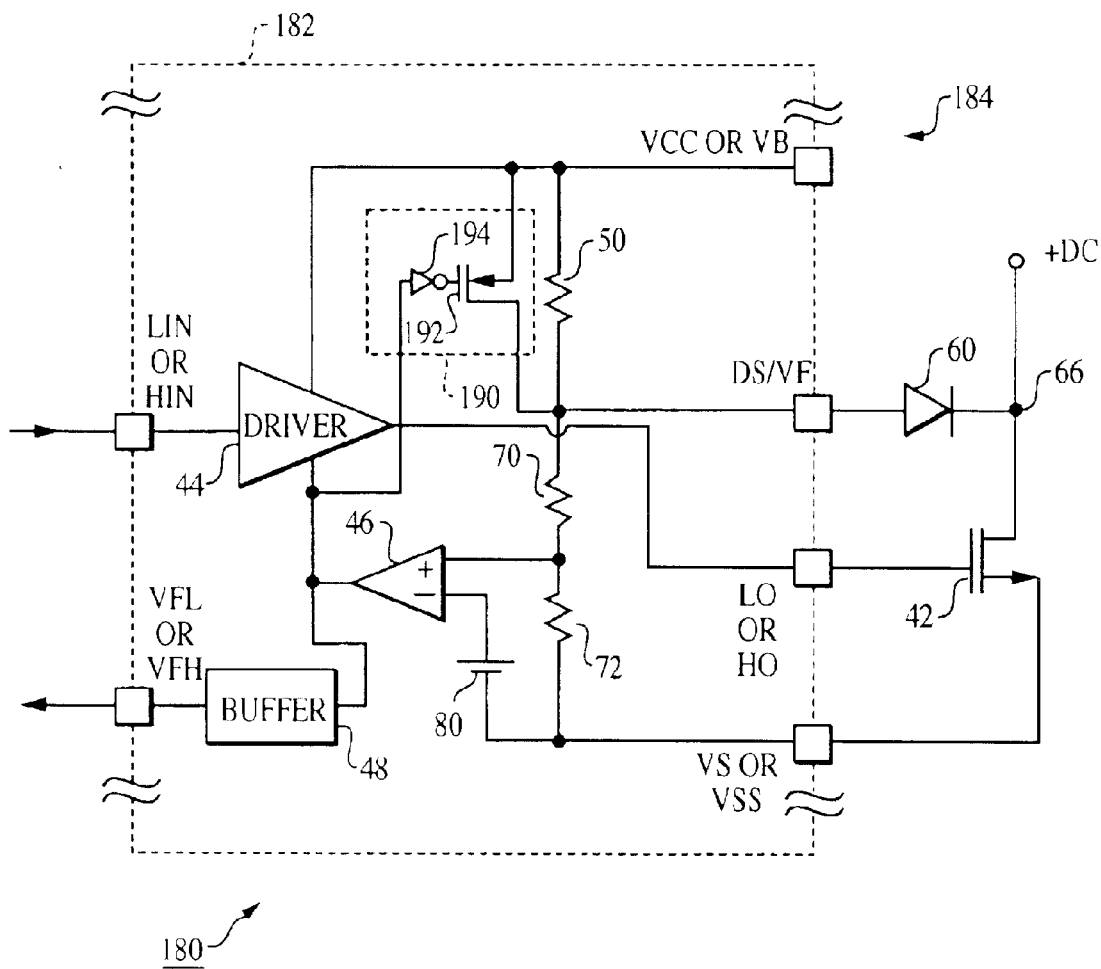
FIG. 5 is a schematic circuit diagram of another power control circuit showing an implementation of a switchable impedance between a power supply and a DS/VF pin.

In FIG. 5, circuit 180 similarly includes components on IC 182 and on board 184 on which IC 182 may be mounted. Components equivalent to components in FIGS. 2 and 4 are labeled with the same reference numerals and can be understood from the above description.

Circuit 180 includes active bias circuitry 190, a more specific implementation of active bias circuitry 160 in FIG. 4. Therefore, circuitry 190 similarly functions as correction circuitry, preventing spurious information and alleviating the interference and sensing problems described above.

Circuitry 190 includes transistor 192, which can be an enhancement mode device that is turned on by a negative gate voltage or any other appropriate switchable impedance device. Like element 162 in FIG. 4, the channel of transistor 192 is connected between a power supply and the DS/VF pin to provide an active impedance at the pin in parallel with resistance 50. When on, transistor 192 can sink any high frequency negative spikes received as a result of capacitive coupling across diode 60, preventing a negative spike from reaching comparator 46 and alleviating the interference problem.

Output from comparator 46 is provided to the gate of transistor 192 through inverter 194, because transistor 192 is turned on by a negative voltage. When the output from comparator 46 is low, transistor 192 is turned off, but when comparator output is high, transistor 192 is turned on. As discussed above, output from comparator 46 is high when FET 42 is off, and the active impedance provided when transistor 192 is on therefore prevents negative spikes from reaching comparator 46 at such times. In this implementation, comparator 46, in addition to its sensing function, performs the function performed by comparator 164 in FIG. 4, providing a signal indicating the state of FET 42.

Figure 3:
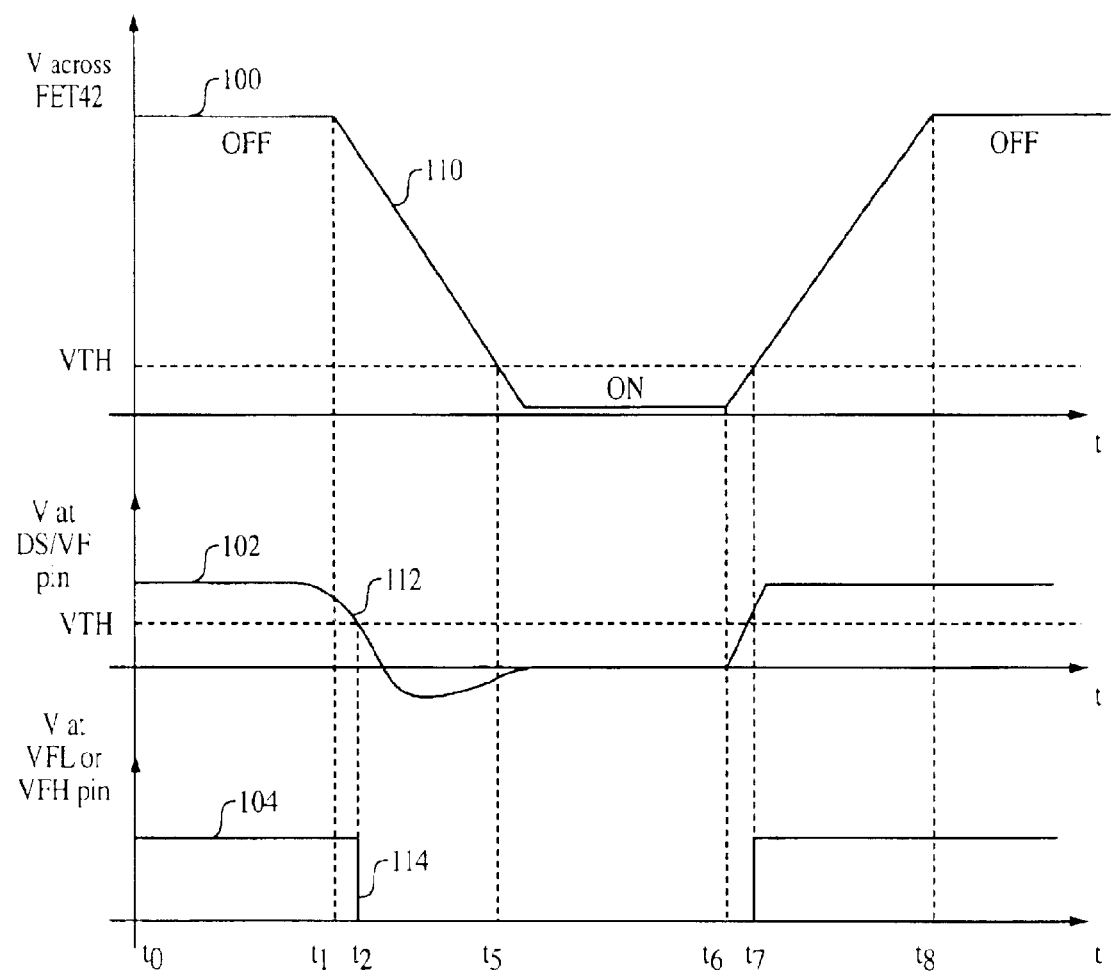
FIG. 3 is a timing diagram showing the relation between three voltages in the circuit of FIGS. 1 and 2—across a power FET, at the respective DS/VF pin, and at the respective voltage feedback output pin—to illustrate inaccuracies in voltage feedback sensing.
Figure 6:
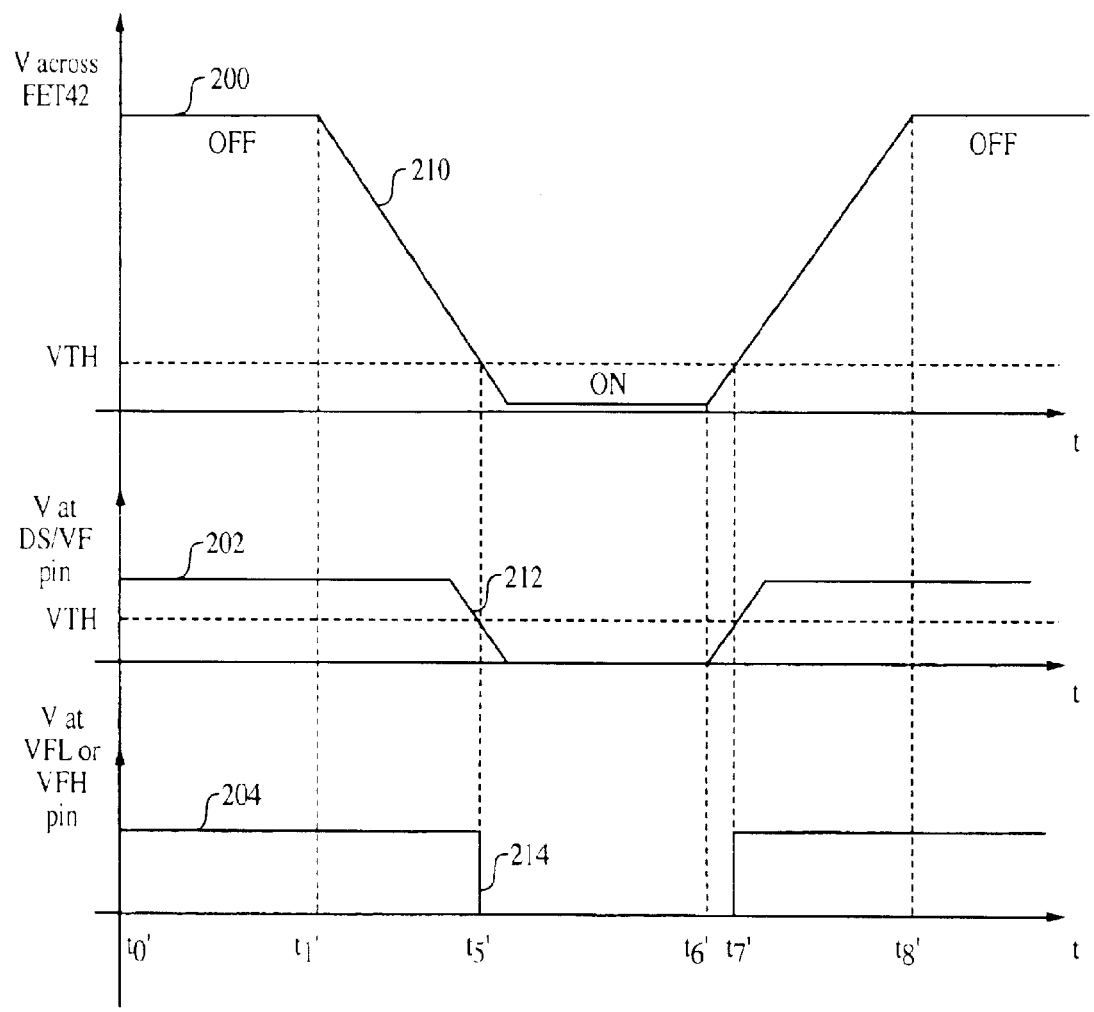
FIG. 6 is a is a timing diagram showing the relation between three voltages as in FIG. 3 for circuits like those in FIGS. 4 and 5, illustrating accurate voltage feedback sensing.

FIG. 6 illustrates how the techniques in FIGS. 4 and 5 alleviate the sensing problem, which shows counterpart waveforms to those in FIG. 3.

From t0' to t1', FET 42 is turned off and the voltage across it has a high value of several hundred volts, as illustrated by segment 200 of the upper waveform. As a result, diode 60 is off, so that the voltage at the DS/VF pin is also high relative to ground, as illustrated by segment 202, and comparator 46 provides a high signal indicating that its "+" input is at a higher voltage than its "−" input, as illustrated by segment 204.

At t1', driver 44 begins to provide a high gate signal to FET 42 to turn it on. As a result, the voltage across FET 42 makes a rapid transition downward from several hundred volts to a few hundred millivolts, illustratively shown by segment 210.

During the off-to-on transition of FET 42, diode 60 remains temporarily off and therefore acts as a capacitor, so that a high frequency negative spike could pass through to the DS/VF pin. But segment 202 continues at the same voltage because an active impedance, provided either by element 162 in FIG. 4 or transistor 192 in FIG. 5, holds the voltage at the DS/VF pin and sinks high frequency spikes. As a result, the active impedance prevents the spikes from reaching the "+" input of comparator 46, and segment 204 continues at the same voltage because the output from comparator 46 is unchanged.

At time t5', however, the voltage across FET 42 crosses below the threshold voltage VTH at which diode 60 switches on. As a result, voltage at the DS/VF pin makes a rapid transition downward, illustrated by segment 212, causing a low sense input signal at the "+" input of comparator 46. Comparator 46 immediately changes state to provide a low output, illustrated by transition 214 immediately after t5'. Unlike transition 114 in FIG. 3, this change of state accurately indicates a time at which the voltage across FET 42 crosses VTH.

During an on-to-off transition of FET 42, illustrated by the waveform segments between times t6', t7', and t8', diode 60 is on and the change of state of comparator 46 at t7' is accurately timed, as in FIG. 3.

Therefore, the techniques in FIGS. 4 and 5 alleviate both the interference and sensing problems.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A control circuit for controlling a driving circuit for driving a power device, comprising:

sensing circuitry for providing a sense result signal for controlling said driving circuit in response to a sense input signal received on a sense input, the sense input signal including information received from the power device over a circuit path from said power device to said sensing circuitry; the sense result signal including information derived from the sense input signal about operation of the power device; and correction circuitry included in said circuit path from said power device to said sensing circuitry for preventing the sense input signal on said circuit path from including spurious information received from the power device, said correction circuitry comprising an active impedance element for presenting a high impedance at said sense input when said power device is on thereby allowing said spurious information to be conducted through the power device and presenting a low impedance at said sense input when said power device is off, thereby shunting said spurious information through said correction circuitry and preventing said sense input signal from including said spurious information.

2. The circuit of claim 1 in which the information from the power device includes spurious negative spikes, the correction circuitry preventing negative spikes in the sense input signal.

3. The circuit of claim 2, further comprising a gating device connected between the sensing circuitry and the power device, in which the gating device is a diode and the power device is a field effect transistor (FET); the diode being turned on when the FET is on and being turned off when the FET is off; the correction circuitry preventing negative spikes in the sense input signal except when the FET is on.

4. The circuit of claim 1 in which the sensing circuitry includes a comparator for comparing signals received at first and second inputs and for providing the sense result signal at an output, the first input receiving the sense input signal and the second input receiving a reference signal; the correction circuitry receiving the sense result signal from the comparator's output and preventing negative spikes in the sense input signal when the sense result signal indicates that the sense input signal is greater than the reference signal.

5. The circuit of claim 4, further comprising an integrated circuit that includes the sensing circuitry and the correction circuitry; the integrated circuit further including:

a sensing node for connecting to the power device; and a voltage source connected to provide the reference signal to the comparator's second input, a first resistance between a supply voltage and the sensing node, a second resistance between the sensing node and the comparator's first input, and a third resistance between the comparator's first input and ground; the voltage source and the first, second, and third resistances having values such that the sense input signal drops below the reference signal if the gating device turns on; the correction circuitry including a switchable impedance parallel to the first resistance, the switchable impedance being turned on only when the sense result signal indicates that the sense input signal is greater than the reference signal.

6. The circuit of claim 1, further comprising an integrated circuit that includes the sensing circuitry and the correction circuitry; the integrated circuit further including a sensing node for connecting to the power device; the correction circuitry including a switchable impedance between a power supply and the sensing node and switching circuitry for switching the impedance on and off in response to a device state signal indicating whether the power device is on or off, the switchable impedance being turned on except when the device state signal indicates that the power device is on.

7. The circuit of claim 6 in which the correction circuitry further includes a comparator for comparing signals received at first and second inputs and for providing the device state signal at its output, the first input receiving a voltage at the sensing node and the second input receiving a reference voltage; the comparator's output being connected for turning the switchable impedance on only when the device state signal indicates that the sensing node voltage is greater than the reference voltage.

8. The circuit of claim 6 in which the sensing circuitry provides the device state signal to the switching circuitry.

9. An integrated control circuit for controlling a driving circuit for driving a power device, comprising:

a sensing node for connecting to the power device;

sensing circuitry for providing a sense result signal for controlling said driving circuit in response to a sense input signal received at the sensing node, the sense input signal including information received at the sensing node from the power device over a circuit path from said power device to said sensing circuitry; the sense result signal including information derived from the sense input signal about operation of the power device; and correction circuitry included in said circuit path from said power device to said sensing circuitry for preventing the sense input signal on said circuit path from including spurious information received at the sensing node from the power device, said correction circuitry comprising an active impedance element for presenting a high impedance at said sensing node when said power device is on thereby allowing said spurious information to be conducted through the power device and presenting a low impedance at said sensing node when said power device is off, thereby shunting said spurious information through said correction circuitry and preventing said sense input signal from including said spurious information.

10. The circuit of claim 9 in which the sensing node is a desat/voltage feedback pin and in which the information from the power device includes spurious negative spikes to the sensing node, the correction circuitry being connected to the sensing node to prevent negative spikes in the sense input signal.

11. The circuit of claim 10, further comprising a gating device connected between the sensing circuitry and the power device, in which the gating device is a diode and the power device is a field effect transistor (FET); the diode being turned on when the FET is on and being turned off when the FET is off; the correction circuitry preventing negative spikes in the sense input signal except when the FET is on.

12. The circuit of claim 9 in which the sensing circuitry includes a comparator for comparing signals received at first and second inputs and for providing the sense result signal at an output, the first input receiving the sense input signal and the second input receiving a reference signal; the correction circuitry receiving the sense result signal from the comparator's output and preventing negative spikes in the sense input signal only when the sense result signal indicates that the sense input signal is greater than the reference signal.

13. The circuit of claim 12, further comprising a voltage source connected to provide the reference signal to the comparator's second input, a first resistance between a supply voltage and the sensing node, a second resistance between the sensing node and the comparator's first input, and a third resistance between the comparator's first input and ground; the capacitance and the first, second, and third resistances having values such that the sense input signal drops below the reference signal if the gating device turns on; the correction circuitry including a switchable impedance path parallel to the first resistance, the switchable impedance path being turned on only when the sense result signal indicates that the sense input signal is greater than the reference signal.

14. The circuit of claim 9 in which the correction circuitry includes a switchable impedance between a power supply and the sensing node and switching circuitry for switching the impedance on and off in response to a device state signal indicating whether the power device is on or off, the switchable impedance being turned on except when the device state signal indicates that the power device is on.

15. The circuit of claim 14 in which the correction circuitry further includes a comparator for comparing signals received at first and second inputs and for providing the device state signal at its output, the first input receiving a voltage at the sensing node and the second input receiving a reference voltage; the comparison result signal being connected for turning the switchable impedance on only when the device state signal indicates that the sensing node voltage is greater than the reference voltage.

16. The circuit of claim 14 in which the sensing circuitry provides the device state signal to the switching circuitry.

17. An integrated control circuit for controlling respective high side and low side driving circuits for driving high and low side power devices connected in a half bridge, the control circuit comprising high side circuitry for controlling the high side driving circuit and low side circuitry for controlling the low side driving circuit;

the high side circuitry comprising:
    a first sensing node for connecting to the high side power device;
    first sensing circuitry for providing a first sense result signal for controlling said high side driving circuit in response to a first sense input signal received at said first sensing node, the first sense input signal including information received at the first sensing node from the high side power device over a first circuit path from said high side power device to said first sensing circuitry; the first sense result signal including information derived from the first sense input signal about operation of the high side power device; and
first correction circuitry included in said first circuit path from said high side power device to said first sensing circuitry for preventing the first sense input signal on said first circuit path from including spurious information received at the first sensing node, said first correction circuitry comprising an active impedance element for presenting a high impedance at said first sensing node when said power device is on thereby allowing said spurious information to be conducted through the power device and presenting a low impedance at said first sensing node when said power device is off, thereby shunting said spurious information through said first correction circuitry and preventing said sense input signal from including said spurious information; and the low side circuitry comprising:
    a second sensing node for connecting to the low side power device;
    second sensing circuitry for providing a second sense result signal for controlling said low side driving circuit in response to a second sense input signal received at the second sensing node, the second sense input signal including information received at the second sensing node from the low side power device over a second circuit path from said low side power device to said second sensing circuitry; the second sense result signal including information derived from the second sense input signal about operation of the low side power device; and
second correction circuitry included in said second circuit path from said low side power device to said second sensing circuitry for preventing the second sense input signal on said second circuit path from including spurious received at the second sensing node, said second correction circuitry comprising an active impedance element for presenting a high impedance at said when said power device is on thereby allowing said spurious information to be conducted through the power device and presenting a low impedance at said second sensing node when said power device is off, thereby shunting said spurious information through said second correction circuitry and preventing said second sense input signal from including said spurious information.

18. The circuit of claim 1, further comprising a driving circuit, wherein said driving circuit receives an input voltage and generates a driving signal for said power device.

19. The circuit of claim 9, further comprising a driving circuit in said integrated circuit, wherein said driving circuit receives an input voltage and generates a driving signal for said power device.

20. An integrated control circuit for controlling respective high side and low side driving circuits for driving high and low side power devices connected in a half bridge, the integrated control circuit comprising high side circuitry for controlling the high side driving circuit and low side circuitry for controlling the low side driving circuit;

the high side circuitry comprising:
    a first sensing node for connecting to the high side power device;
    first sensing circuitry for providing a first sense result signal for controlling said high side driving circuit in response to a first sense input signal received at the first sensing node, the first sense input signal including information received at the first sensing node from the high side power device over a first circuit path from said high side power device to said first sensing circuitry; the first sense result signal including information derived from the first sense input signal about operation of the high side power device; and
first correction circuitry included in said first circuit path from said high side power device to said first sensing circuitry for preventing the first sense input signal on said first circuit path from including spurious information received at the first sensing node, said first correction circuitry comprising an active impedance element for presenting a high impedance at said first sensing node when said power device is on thereby allowing said spurious information to be conducted through the power device and presenting a low impedance at said first sensing node when said power device is off, thereby shunting said spurious information through said first correction circuitry and preventing said sense input signal from including said spurious information; and the low side circuitry comprising:

a second sensing node for connecting to the low side power device;

second sensing circuitry for providing a second sense result signal for controlling said low side driving circuit in response to a second sense input signal received at the second sensing node, the second sense input signal including information received at the second sensing node from the low side power device over a second circuit path from said low side power device to said second sensing circuitry; the second sense result signal including information derived from the second sense input signal about operation of the low side power device;

second correction circuitry included in said second circuit path from said low side power device to said second sensing circuitry for preventing the second sense input signal on said second circuit path from including spurious information received at the second sensing node, said second correction circuitry comprising an active impedance element for presenting a high impedance at said second sensing node when said power device is on thereby allowing said spurious information to be conducted through the power device and presenting a low impedance at the second sensing node when said power device is off, thereby shunting said spurious information through said second correction circuitry and preventing said second sense input signal from including said spurious information;

said integrated circuit further comprising said high side driving circuit disposed in said integrated circuit, wherein said high side driving circuit receives an input voltage and generates a driving signal for said high side power device; and said integrated circuit further comprising said low side driving circuit disposed in said integrated circuit, wherein said low side driving circuit receives an input voltage and generates a driving signal for said low side power device.

21. The circuit of claim 9, in which the gating device provides spurious negative spikes, the correction circuitry preventing negative spikes in the sense input signal.

22. The circuit of claim 17, in which the gating device provides spurious negative spikes, the correction circuitry preventing negative spikes in the sense input signal.

23. The circuit of claim 1, wherein said spurious information includes at least one of high-frequency noise and a negative voltage spike.

24. The circuit of claim 9, wherein said spurious information includes at least one of high-frequency noise and a negative voltage spike.

25. The circuit of claim 17, wherein said spurious information includes at least one of high-frequency noise and a negative voltage spike.

26. The circuit of claim 5, further comprising a driving circuit in said integrated circuit, wherein said driving circuit receives an input voltage and generates a driving signal for said power device.

27. The circuit of claim 6, further comprising a driving circuit in said integrated circuit, wherein said driving circuit receives an input voltage and generates a driving signal for said power device.

* * * * *